US011294433B2

United States Patent
Chen et al.

(10) Patent No.: US 11,294,433 B2
(45) Date of Patent: Apr. 5, 2022

(54) SYSTEM AND METHOD FOR INTEGRATED THERMAL AND CABLE ROUTING FOR SERVER REAR MODULES

(71) Applicant: DELL PRODUCTS, LP, Round Rock, TX (US)

(72) Inventors: Yi Chang Chen, New Taipei (TW); Kuang Hsi Lin, Bade District (TW)

(73) Assignee: Dell Products L.P., Round Rock, TX (US)

( * ) Notice: Subject to any disclaimer, the term of this patent is extended or adjusted under 35 U.S.C. 154(b) by 63 days.

(21) Appl. No.: 16/939,638

(22) Filed: Jul. 27, 2020

(65) Prior Publication Data

US 2022/0026965 A1    Jan. 27, 2022

(51) Int. Cl.
*H05K 7/20* (2006.01)
*G06F 1/18* (2006.01)
*H01R 12/73* (2011.01)
*G06F 1/20* (2006.01)

(52) U.S. Cl.
CPC ............. *G06F 1/185* (2013.01); *G06F 1/20* (2013.01); *H01R 12/737* (2013.01); *H05K 7/20145* (2013.01)

(58) Field of Classification Search
CPC . G06F 1/185; G06F 1/20; G06F 1/186; G06F 1/183; G06F 13/409; G06F 1/206; H05K 7/20145; H01R 12/721; H01R 12/737; H01R 13/6587

USPC .... 361/695, 752, 801, 796, 690, 756, 679.4, 361/679.32, 719, 688, 679.51, 736, 720; 165/104.33

See application file for complete search history.

(56) References Cited

U.S. PATENT DOCUMENTS

| 8,559,189 | B2   | 10/2013 | Li |
| 8,837,135 | B2 * | 9/2014  | Zheng ................ H05K 7/1421 361/679.32 |
| 2009/0231802 | A1 * | 9/2009 | Lin ........................ G06F 1/185 361/679.46 |
| 2014/0268552 | A1 | 9/2014 | Provenzale et al. |

* cited by examiner

Primary Examiner — Mandeep S Buttar
(74) Attorney, Agent, or Firm — Larson Newman, LLP

(57) ABSTRACT

An information processing system includes a processor, a memory device, and riser card. The riser card includes a riser card cage, a circuit card, and a baffle. The circuit card is installed into the riser card cage and includes a card edge and a connector affixed to the circuit card. The card edge is configured to be installed into another connector on an information handling system in a first orientation. The connector is configured to receive a card edge of an add-in card in a second orientation perpendicular to the first orientation. The baffle is integrated with the riser card cage. The baffle is configured to divert a first air flow from the processor away from the riser card cage, and to channel a second air flow from the memory device into the riser card cage.

20 Claims, 5 Drawing Sheets

SYSTEM AND METHOD FOR INTEGRATED THERMAL AND CABLE ROUTING FOR SERVER REAR MODULES

FIELD OF THE DISCLOSURE

This disclosure generally relates to information handling systems, and more particularly relates to integrated thermal and cable routing for rear modules in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information processing system may include a processor, a memory device, and riser card. The riser card may include a riser card cage, a circuit card, and a baffle. The circuit card may be installed into the riser card cage and may include a card edge and a connector affixed to the circuit card. The card edge may be configured to be installed into another connector on an information handling system in a first orientation. The connector may be configured to receive a card edge of an add-in card in a second orientation perpendicular to the first orientation. The baffle may be integrated with the riser card cage. The baffle may be configured to divert a first air flow from the processor away from the riser card cage, and to channel a second air flow from the memory device into the riser card cage.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
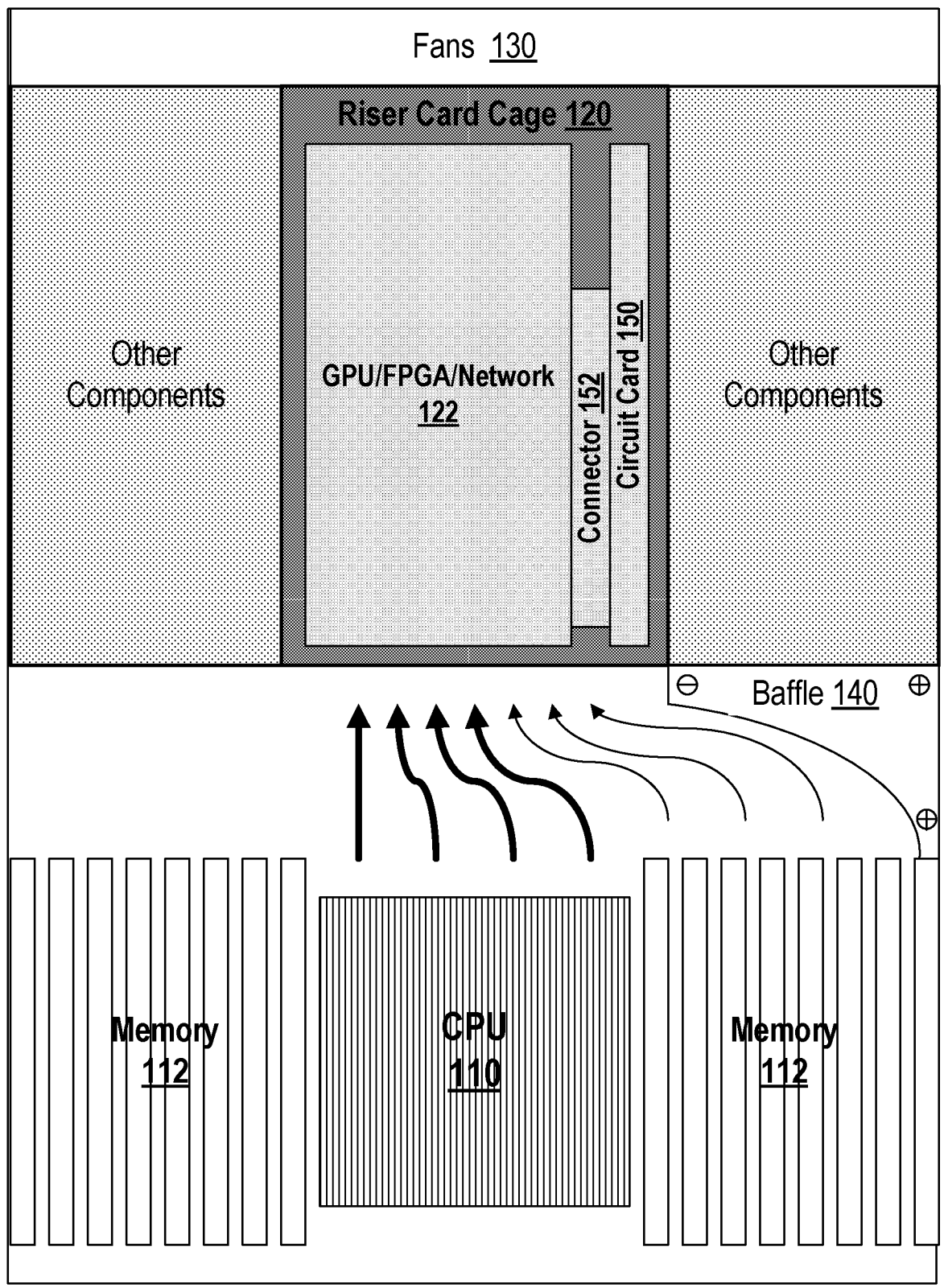
FIG. 1 is a block diagram of an information handling system of the prior art.

FIG. 1 illustrates an information handling system 100 in accordance with the prior art. Information handling system 100 represents a system that is highly constrained in terms of main board real estate and air flows of ambient air to cool the components of the information handling system. For example, information handling system 100 may represent a rack mountable 1U or 2U server with components densely packed onto the server main board, and with tight thermal tolerances for the temperature of the cooling air at various locations within the server. In a typical 1U or 2U server, rotating data storage media such as disk drives, not illustrated, are located in the front of the server, where chilled ambient air from a datacenter is drawn in to cool the disk drives. Behind the disk drives, the typical 1U or 2U server includes various high-heat generating components that receive the air flow from the disk drives to cool the high-heat generating components. As such, information handling system 100 illustrates the high-heat generating components to include one or more central processing unit (CPU) 110, henceforth referred to as a "processor," and one or more banks of memory modules 112, such as Dual In-Line Memory Modules (DIMMs). It will be understood that the high-heat generating components may include other components, such as chip set I/O hubs, other controllers, ASICs, or other components, as needed or desired.

Behind the high-heat generating components, the typical 1U or 2U server includes other components, including one or more riser card cage 120. One or more fan 130 is typically located at the back of the typical 1U or 2U server to draw the chilled ambient air from the front of the server through the disk drives, through the high-heat generating components, and finally through other components including riser card cage 120. It will be understood that from the front to the back of the typical 1U or 2U, a temperature gradient will exist, with the coolest air being at the front of the 1U or 2U server, and the warmest air being exhausted out the back of the 1U or 2U server by fans 130. Thus, as used herein, the "front" of information handling system 100 and the frontward direction will be understood to refer to locations upstream in an air flow in the information handling system, while the "back" or "rear" of the information handling system and the rearward direction will be understood to refer to locations downstream in the air flow. It will be further understood that the typical 1U or 2U server may include one or more additional fans to ensure the continued air flow of sufficient volumes of air through information handling system 100 to ensure adequate cooling of the components, as needed or desired. Still further, it will be understood that a typical CPU in a 1U server generates a significant amount of heat, in excess of an amount of heat generated by the DIMMs.

Riser card cage 120 is a component that provides connectivity to the main board of information handling system 100 for components to be installed horizontally within the confines of the information handling system. For example, it will be understood that a typical PCIe add-in card has a height of around 4.8 inches. On the other hand, a 1U server has a height of 1.75 inches, and a 2U server has a height of 3.5 inches. Thus, in order to accommodate the installation of one or more PCIe add-in card, riser card cage 120 is configured to be installed into a PCIe connector on the main board of information handling system 100, and to provide a second PCIe connector that is oriented perpendicular to the PCIe connector on the main board. In this way, PCIe add-in cards can be installed horizontally within the confines of 1U or 2U servers. As such, riser card cage 120 includes a circuit card 150 installed into the riser cage. The circuit card includes a card edge connector with connector pads. The card edge connector is configured to be installed into a connector affixed to a main board of information handling system 100. The combination of the card edge connector of circuit card 150 and the connector on the main board function to provide mechanical mounting of the circuit card to the main board, and to provide power and signaling to the circuit board in accordance with a particular data communication interface standard. A second connector 152 is affixed to the circuit board perpendicular to the card edge connector, and circuit card 150 provides connectivity between the connector pads on the card edge connector and connector 152.

Riser card cage 120 is illustrated as being installed with an add-in card 122. An example of add-in card 122 may include a graphics processing unit (GPU), a field-programmable gate array (FPGA), a network adapter, a storage adapter, or the like, as needed or desired. As such, riser card cage 120 will be understood to represent a portion of information handling system 100 that requires significant cooling. In particular, where riser card cage 120 is located downstream from a particularly high-heat generating component, such as processor 110, the ambient temperature of the air coming from the processor may be so high as to prevent the riser card cage from receiving cool enough air to adequately cool add-in card 122. Thus, while illustrated as a PCIe riser card cage with an installed PCIe riser card, riser card cage 120 will be understood more generally to represent any component that is located within the air flow in information handling system 100 at a location that is directly downstream from a component of the information handling system that generates significant amounts of heat such that the cooling of the component cannot be assured if the only cooling air comes directly from the particular heat-generating component.

As such, information handling system 100 includes a baffle 140 that operates as an air dam to divert cooler air toward riser card cage 120. In this way, riser card cage 120 and add-in card 122 are cooled not just by the air flow from processor 110, but also by the air flow from DIMMs 112. This prior art solution may improve the situation for cooling of riser card cage 120 and add-in card 122, however, problems may still persist. In particular, because riser card 120 and add-in card 122 are cooled by a mixture of the air flows from processor 110 and DIMMs 112, the temperature of the air entering the riser card cage may still be too high to adequately cool the add-in card. Further, the channeling of the air flow from DIMMs 112 may simply compress the flow of the hotter air from processor 110, such that the components at the top of add-in card 122, here illustrated at the left side of the add-in card due to the horizontal mounting thereof, may still only receive the hotter air from processor 110, and thus the components at the top of the add-in card may still receive inadequate cooling air flows.

Next, the space constraints on a typical 1U or 2U server means that the use and placement of baffles is limited. Here, first, the typical distance between the back of a heat sink for processor 110 or the back of DIMMs 112 and the front of riser card cage 120 is very small (less than 1 inch). Thus the amount of air that can be reasonably channeled by baffle 140 is typically low. Second, baffle 140 is typically attached to a main board of information handling system 100 via screws that protrude through the main board. Thus, the amount of space needed for the mounting of baffles reduces the amount of useable space for other components on the main board. Moreover, the typical 1U server or 2U server may also utilize the space between the back of a heat sink for processor 110 or the back of DIMMs 112 and the front of riser card cage 120 for the routing of various connector cables between components of the server. Here, the inclusion of connector cables in the space between the back of a heat sink for processor 110 or the back of DIMMs 112 and the front of riser card cage 120 may result in blockages of the air flows, particularly if the connector cables are loose and not constrained from falling into the air flows. Finally, the use of baffle 140 necessitates an additional part skew to be installed into information handling system 100, thus increasing the part count for the information handling system and increasing the process steps in manufacturing the information handling system.

Figure 2:
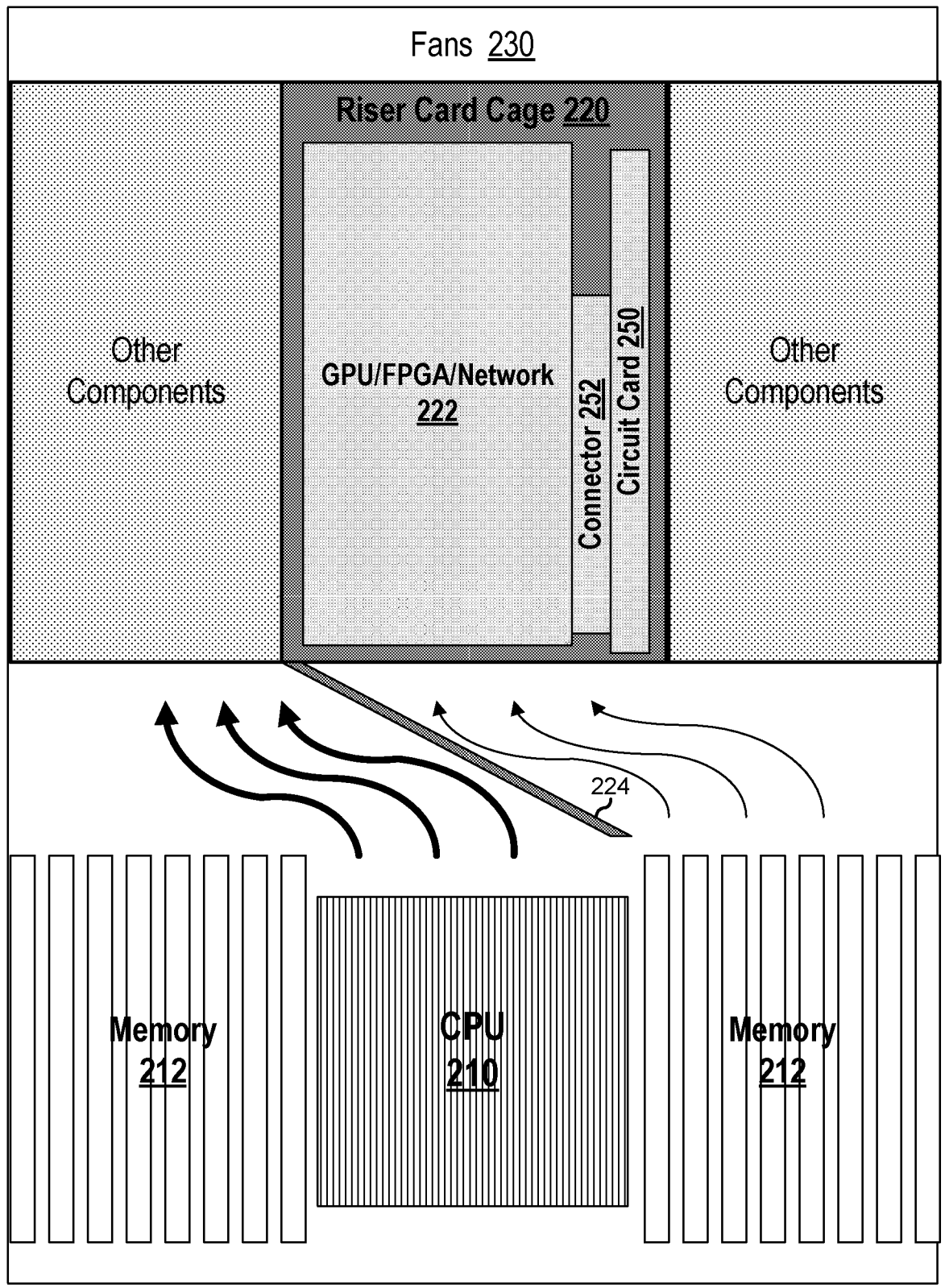
FIG. 2 is a block diagram of an information handling system in accordance with an embodiment of the present disclosure.

FIG. 2 illustrates an information handling system 200 in accordance with an embodiment of the present invention. Information handling system 200 is similar to information handling system 100, and represents a system that is highly constrained in terms of main board real estate and air flows of ambient air to cool the components of the information handling system. As such, information handling system 200 illustrates high-heat generating components to include one or more processor 210, and one or more banks of DIMMs 212. It will be understood that the high-heat generating components may include other components, such as chip set I/O hubs, other controllers, ASICs, or other components, as needed or desired. Behind the high-heat generating components, information handling system 200 includes other components, such as one or more riser card cage 220. One or more fan 230 is located at the back of information handling system 200 to draw the chilled ambient air from the front of the server through the disk drives, through the high-heat generating components, and finally through the other components including riser card cage 220. As described above, from the front to the back of information handling system 200, a temperature gradient will exist, with the coolest air being at the front of the information handling system, and the warmest air being exhausted out the back of the information handling system by fans 230. It will be further understood that information handling system 200 may include one or more additional fans to ensure the continued air flow of sufficient volumes of air through the information handling system to ensure adequate cooling of the components, as needed or desired. Still further, it will be understood that processor 210 generates a significant amount of heat, in excess of an amount of heat generated by the DIMMs.

Riser card cage 220 is similar to riser card cage 120, and represents a component that provides connectivity to the main board of information handling system 200 for components to be installed horizontally within the confines of the information handling system. Riser card cage 220 includes a circuit card 250 installed into the riser cage and a connector 252 affixed to the circuit board perpendicular to a card edge connector of the circuit board. Circuit card 150 provides connectivity between the connector pads on the card edge connector and connector 152. Riser card cage 220 is illustrated as being installed with an add-in card 222. An example of add-in card 222 may include a graphics processing unit (GPU), a field-programmable gate array (FPGA), a network adapter, a storage adapter, or the like, as needed or desired. Riser card cage 220 will be understood to represent a portion of information handling system 200 that requires significant cooling. In particular, where riser card cage 220 is located downstream from a particularly high-heat generating component, such as processor 210, the ambient temperature of the air coming from the processor may be so high as to prevent the riser card cage from receiving cool enough air to adequately cool add-in card 222. Thus, while illustrated as a PCIe riser card cage with an installed PCIe riser card, riser card cage 220 will be understood more generally to represent any component that is located within the air flow in information handling system 200 at a location that is directly downstream from a component of the information handling system that generates significant amounts of heat such that the cooling of the component cannot be assured if the only cooling air comes directly from the particular heat-generating component.

Figure 3:
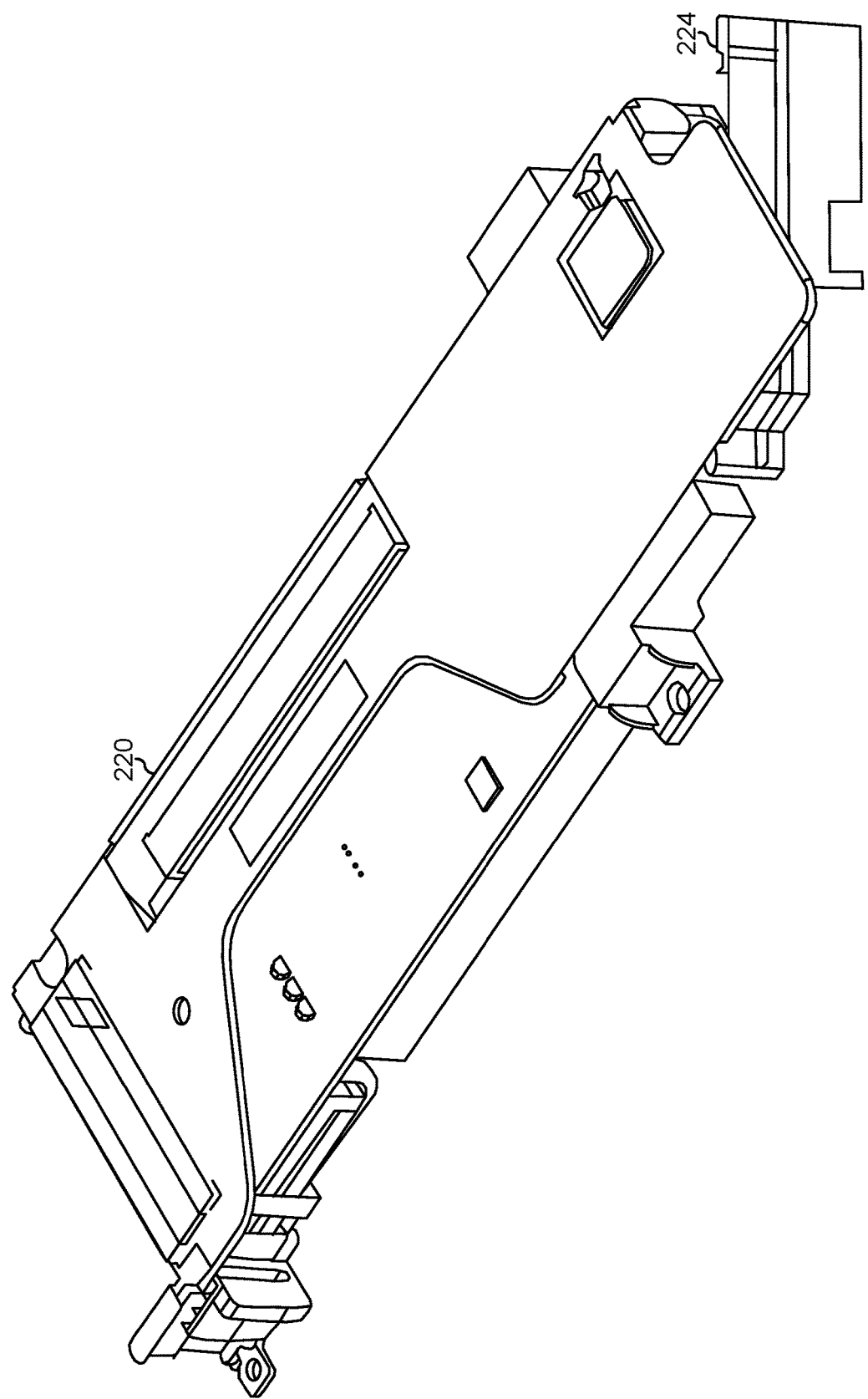
FIG. 3 illustrates a riser card cage of the information handling system of FIG. 2.

However, in contrast to information handling system 100 that includes baffle 140 to divert cooler air toward riser card cage 120, here, riser card cage 220 includes an integrated baffle 224 that operates as an air dam to divert hotter air away from the riser card cage and to channel cooler air toward the riser card cage. FIG. 3 illustrates a view of riser card cage 220 and integrated baffle 224. In a particular embodiment, integrated baffle 224 is fabricated as an integral part of riser card cage 220. For example, riser card cage 220 may be fabricated from a single piece of sheet metal that is stamped, cut, and shaped as needed, and integrated baffle 224 can likewise be fabricated of the same piece of sheet metal. In another example, riser card cage 220 may be a molded plastic piece, with integrated baffle 224 comprising a part of the molded piece. In another embodiment, integrated baffle 224 represents a separate piece part that is assembled into riser card cage 220 when the riser card cage is assembled. For example, integrated baffle 224 can be spot welded to riser card cage 220, can be bonded to the riser card cage, and be attached to the riser card cage using one or more fastener, or the like.

With the inclusion of integrated baffle 224 with riser card cage 220, the hotter air flow from processor 210 is diverted away from the riser card cage, and only the cooler air flow from DIMMs 212 is channeled to the riser card cage. As such, information handling system 200 resolves the issues derived from information handling system 100. In particular, because riser card 220 and add-in card 222 are cooled by the air flow from DIMMs 212 and the air flow from processor 210 is diverted away from the riser card by integrated baffle 224, the temperature of the air entering the riser card cage is cooler, thereby increasing the ability to adequately cool the add-in card. Further, the air flow from DIMMs 212 is distributed more completely across riser card cage 220, such that all of the components along the width of add-in card 222 receive the cooler air from the DIMMs, thereby improving the overall cooing of the add-in card.

Next, the inclusion of integrated baffle 224 with riser card cage 220 better accommodates the space constraints on information handling system 200. First, the limited distance between the back of a heat sink for processor 210 or the back of DIMMs 212 and the front of riser card cage 220 is less of a problem because, instead of squeezing the air flows from processor 110 and DIMMs 112 into the space of riser card cage 120, as is done in information handling system 100, only the air flow from DIMMs 212 is routed to riser card cage 220. That is, where baffle 140 of information handling system 100 operates to compress air flows, integrated baffle 224 provides less resistance to air flow, leading to improved cooling of the riser card cage and add-in card 222. Second, integrated baffle 224, being attached to riser card 220, does not demand any space on the main board of information handling system 200 for screws to attach the integrated baffle, and the amount of useable space for other components on the main board is increased.

Figure 4:
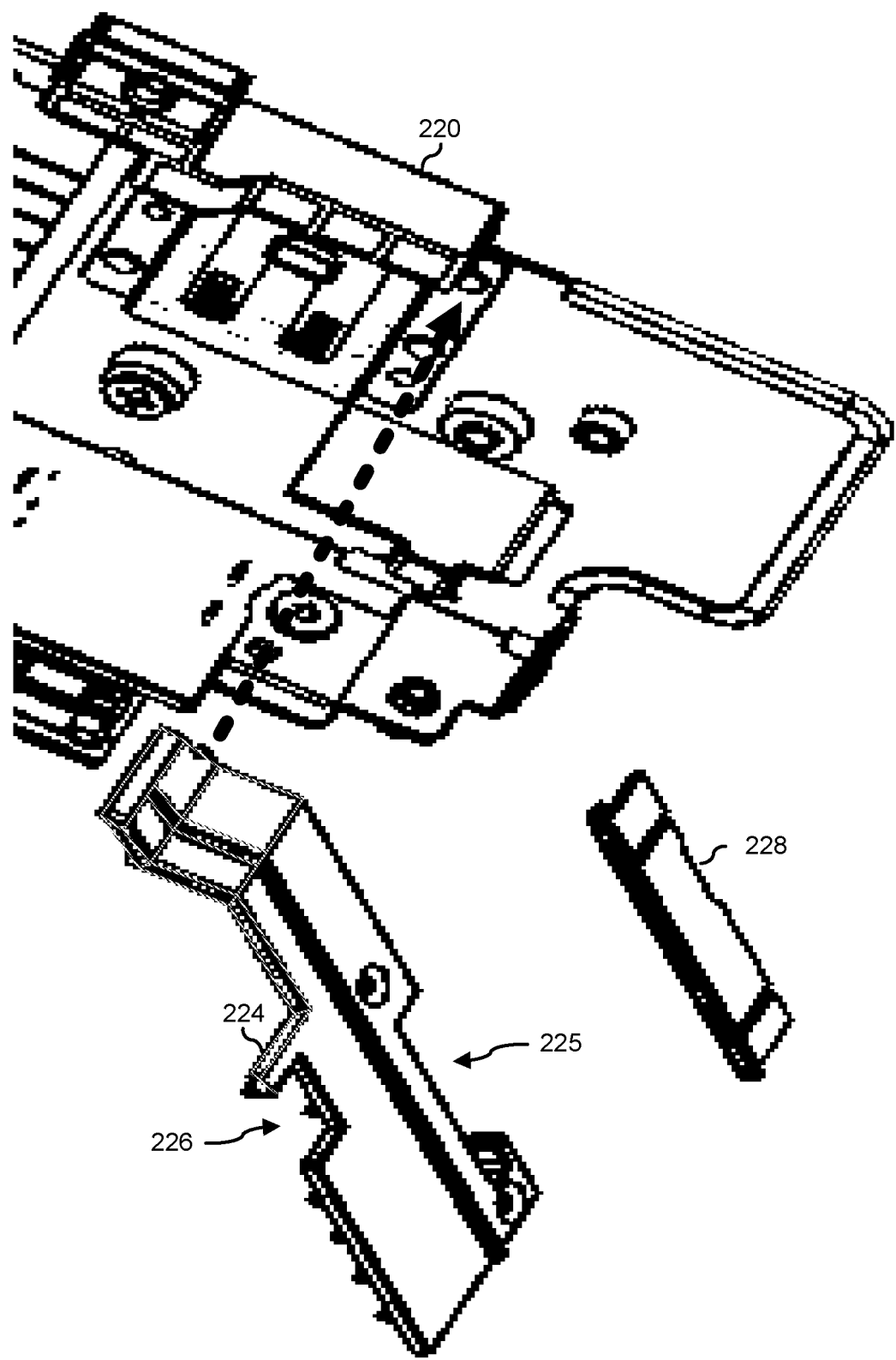
FIG. 4 is an exploded view of the riser card cage of FIG. 3.

Moreover, where information handling system 200 utilizes the space between the back of a heat sink for processor 210 or the back of DIMMs 212 and the front of riser card cage 220 for the routing of various connector cables between components of the server, the inclusion of connector cables in the space between the back of the heat sink or the back of the DIMMs and the front of the riser card cage is managed by integrated baffle 224. In particular, FIG. 4 illustrates an exploded view of riser card cage 220 and integrated baffle 224. Here, integrated baffle 224 is shown to include a cut-out 225 through which connector cables can be routed when needed. The inclusion of cut-out 225 in integrated baffle 224 not only provides a channel through which any connector cables can be routed, but also functions to retain the connector cables and prevent the connector cables from falling into the air flows to riser card cage 220. In a particular embodiment, integrated baffle 220 includes one or more additional cut-out 226 that is positioned to permit the installation of riser card cage 220 and avoid interferences with components installed onto the main board of information handling system 200. In particular, the inclusion of cut-out 228 shaped for and aligned with a PCIe connector on the main board may permit the easy installation and removal of riser card cage 220 from the back side of information handling system 200. In a particular embodiment, integrated baffle 224 includes a flexible flapper 228 installed into cut-out 225. Here, when information handling system 200 does not route connector cables between components in the space between the back of a heat sink for processor 210 or the back of DIMMs 212 and the front of riser card cage 220, flapper 228 can be placed into a closed position to close cut-out 225 to ensure greater air flow from DIMMs 212 and to prevent air flow from processor 210. Further, when information handling system 200 routes connector cables between components in the space between the back of a heat sink for processor 210 or the back of DIMMs 212 and the front of riser card cage 220, flapper 228 can be placed into an open position to open cut-out 225 to permit the routing of the connector cables. In a particular embodiment, flapper 228 is a separate piece and is installed into integrated baffle 224 such that the flapper is hinged to have an open position and a closed position. In another embodiment, flapper 228 is fabricated as a single piece with integrated baffle 224. For example, where integrated baffle 224 is fabricated of a flexible material, the integrated baffle may be fabricated such that flapper 228 is in a default closed position. Then, if needed, flapper 228 can be bent to an open position to accommodate any connector cables. In another embodiment, flapper 228 is a break-away portion of integrated baffle 224 that is in the closed position when fabricated. Then, when riser card cage 220 is installed into information handling system 200, flapper 228 can be removed as needed to accommodate any connector cables. Finally, the use of integrated baffle 240 mitigates the need for additional part skews to be installed into information handling system 100, thus lowering the part count for the information handling system and reducing the process steps in manufacturing the information handling system.

Figure 5:
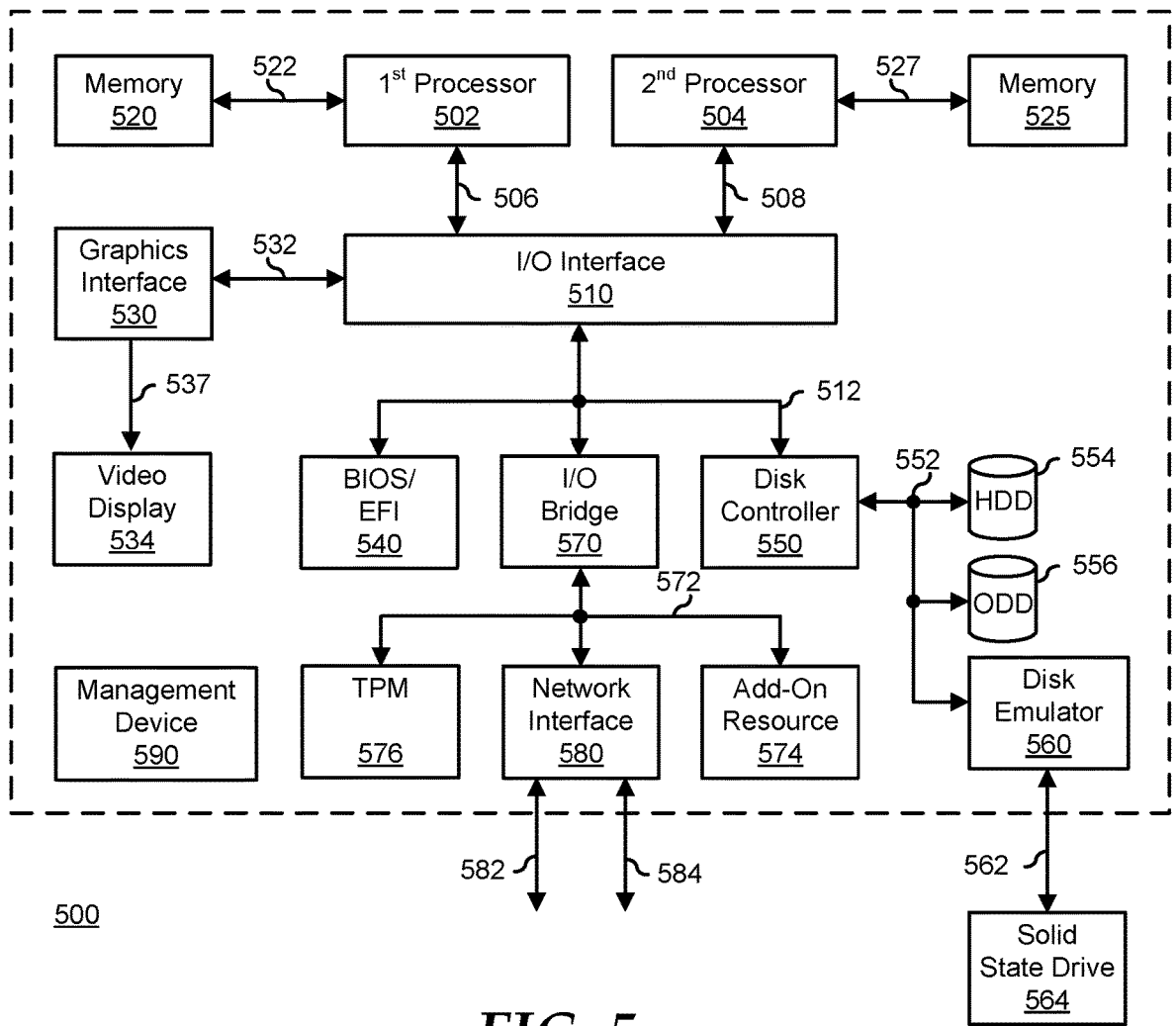
FIG. 5 is a block diagram illustrating a generalized information handling system according to another embodiment of the present disclosure.

FIG. 5 illustrates a generalized embodiment of an information handling system 500 similar to information handling systems 100 and 200. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 500 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 500 can include processing resources for executing machine-executable code, such as a central processing unit (CPU), a programmable logic array (PLA), an embedded device such as a System-on-a-Chip (SoC), or other control logic hardware. Information handling system 500 can also include one or more computer-readable medium for storing machine-executable code, such as software or data. Additional components of information handling system 500 can include one or more storage devices that can store machine-executable code, one or more communications ports for communicating with external devices, and various input and output (I/O) devices, such as a keyboard, a mouse, and a video display. Information handling system 500 can also include one or more buses operable to transmit information between the various hardware components.

Information handling system 500 can include devices or modules that embody one or more of the devices or modules described below, and operates to perform one or more of the methods described below. Information handling system 500 includes a processors 502 and 504, an input/output (I/O) interface 510, memories 520 and 525, a graphics interface 530, a basic input and output system/universal extensible firmware interface (BIOS/UEFI) module 540, a disk controller 550, a hard disk drive (HDD) 554, an optical disk drive (ODD) 556, a disk emulator 560 connected to an external solid state drive (SSD) 562, an I/O bridge 570, one or more add-on resources 574, a trusted platform module (TPM) 576, a network interface 580, a management device 590, and a power supply 595. Processors 502 and 504, I/O interface 510, memory 520, graphics interface 530, BIOS/UEFI module 540, disk controller 550, HDD 554, ODD 556, disk emulator 560, SSD 562, I/O bridge 570, add-on resources 574, TPM 576, and network interface 580 operate together to provide a host environment of information handling system 500 that operates to provide the data processing functionality of the information handling system. The host environment operates to execute machine-executable code, including platform BIOS/UEFI code, device firmware, operating system code, applications, programs, and the like, to perform the data processing tasks associated with information handling system 500.

In the host environment, processor 502 is connected to I/O interface 510 via processor interface 506, and processor 504 is connected to the I/O interface via processor interface 508. Memory 520 is connected to processor 502 via a memory interface 522. Memory 525 is connected to processor 504 via a memory interface 527. Graphics interface 530 is connected to I/O interface 510 via a graphics interface 532, and provides a video display output 536 to a video display 534. In a particular embodiment, information handling system 500 includes separate memories that are dedicated to each of processors 502 and 504 via separate memory interfaces. An example of memories 520 and 530 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 540, disk controller 550, and I/O bridge 570 are connected to I/O interface 510 via an I/O channel 512. An example of I/O channel 512 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 510 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 540 includes BIOS/UEFI code operable to detect resources within information handling system 500, to provide drivers for the resources, initialize the resources, and access the resources. BIOS/UEFI module 540 includes code that operates to detect resources within information handling system 500, to provide drivers for the resources, to initialize the resources, and to access the resources.

Disk controller 550 includes a disk interface 552 that connects the disk controller to HDD 554, to ODD 556, and to disk emulator 560. An example of disk interface 552 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 560 permits SSD 564 to be connected to information handling system 500 via an external interface 562. An example of external interface 562 includes a USB interface, an IEEE 1394 (Firewire) interface, a proprietary interface, or a combination thereof. Alternatively, solid-state drive 564 can be disposed within information handling system 500.

I/O bridge 570 includes a peripheral interface 572 that connects the I/O bridge to add-on resource 574, to TPM 576, and to network interface 580. Peripheral interface 572 can be the same type of interface as I/O channel 512, or can be a different type of interface. As such, I/O bridge 570 extends the capacity of I/O channel 512 when peripheral interface 572 and the I/O channel are of the same type, and the I/O bridge translates information from a format suitable to the I/O channel to a format suitable to the peripheral channel 572 when they are of a different type. Add-on resource 574 can include a data storage system, an additional graphics interface, a network interface card (NIC), a sound/video processing card, another add-on resource, or a combination thereof. Add-on resource 574 can be on a main circuit board, on separate circuit board or add-in card disposed within information handling system 500, a device that is external to the information handling system, or a combination thereof.

Network interface 580 represents a NIC disposed within information handling system 500, on a main circuit board of the information handling system, integrated onto another component such as I/O interface 510, in another suitable location, or a combination thereof. Network interface device 580 includes network channels 582 and 584 that provide interfaces to devices that are external to information handling system 500. In a particular embodiment, network channels 582 and 584 are of a different type than peripheral channel 572 and network interface 580 translates information from a format suitable to the peripheral channel to a format suitable to external devices. An example of network channels 582 and 584 includes InfiniBand channels, Fibre Channel channels, Gigabit Ethernet channels, proprietary channel architectures, or a combination thereof. Network channels 582 and 584 can be connected to external network resources (not illustrated). The network resource can include another information handling system, a data storage system, another network, a grid management system, another suitable resource, or a combination thereof.

Management device 590 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 500. In particular, management device 590 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 500, such as system cooling fans and power supplies. Management device 590 can include a network connection to an external management system, and the management device can communicate with the management system to report status information for information handling system 500, to receive BIOS/UEFI or system firmware updates, or to perform other task for managing and controlling the operation of information handling system 500. Management device 590 can operate off of a separate power plane from the components of the host environment so that the management device receives power to manage information handling system 500 when the information handling system is otherwise shut down. An example of management device 590 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 590 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A riser card, comprising:
   a riser card cage;
   a circuit card installed into the riser card cage and including a first card edge and a first connector affixed to the circuit card, wherein the first card edge is configured to be installed into a second connector of an information handling system in a first orientation, wherein the first connector is configured to receive a card edge of an add-in card in a second orientation perpendicular to the first orientation; and
   a baffle integrated with the riser card cage, the baffle configured to divert a first air flow away from the riser card cage, and to channel a second air flow into the riser card cage.

2. The riser card of claim 1, wherein the baffle includes a first cut out area configured to retain a connector cable of the information handling system.

3. The riser card of claim 2, wherein the baffle further includes a flapper assembled into the first cut out area.

4. The riser card of claim 3, wherein the flapper is configured in a closed position to fill the first cut out area, and is configured in an open position to leave the cut out area unfilled.

5. The riser card of claim 4, wherein the flapper is hinge mounted to the baffle.

6. The riser card of claim 5, wherein the flapper is bent into the open position.

7. The riser card of claim 2, wherein the baffle includes a second cut out area configured to provide a clearance to a component affixed to the information handling system.

8. The riser card of claim 1, wherein the baffle is fabricated as a single piece with the riser card cage.

9. The riser card of claim 1, wherein the baffle is a separate piece from the riser card cage.

10. The riser card of claim 1, wherein the riser card is a PCIe riser card.

11. A method, comprising:
    installing, in a riser card cage, a circuit card, the circuit card including a first card edge and a first connector affixed to the circuit card;
    installing the first card edge into a second connector of an information handling system in a first orientation, wherein the first connector is configured to receive a card edge of an add-in card in a second orientation perpendicular to the first orientation; and
    providing a baffle integrated with the riser card cage, the baffle configured to divert a first air flow away from the riser card cage, and to channel a second air flow into the riser card cage.

12. The method of claim 11, further comprising:
providing, on the baffle, a first cut out area configured to retain a connector cable of the information handling system.

13. The method of claim 12, further comprising:
assembling, onto the baffle, a flapper in the first cut out area.

14. The method of claim 13, wherein the flapper is configured in a closed position to fill the first cut out area, and is configured in an open position to leave the cut out area unfilled.

15. The method of claim 14, wherein the flapper is hinge mounted to the baffle.

16. The method of claim 15, further comprising:
bending the flapper into the open position.

17. The method of claim 12, further comprising:
assembling, into the baffle, a second cut out area configured to provide a clearance to a component affixed to the information handling system.

18. The method of claim 11, wherein the baffle is fabricated as a single piece with the riser card cage.

19. The method of claim 11, wherein the baffle is a separate piece from the riser card cage.

20. An information processing system, comprising:
a processor;
a memory device; and
riser card, including:
 a riser card cage;
 a circuit card installed into the riser card cage and including a first card edge and a first connector affixed to the circuit card, wherein the first card edge is configured to be installed into a second connector of an information handling system in a first orientation, wherein the first connector is configured to receive a card edge of an add-in card in a second orientation perpendicular to the first orientation; and
 a baffle integrated with the riser card cage, the baffle configured to divert a first air flow from the processor away from the riser card cage, and to channel a second air flow from the memory device into the riser card cage.

* * * * *